United States Patent [19]

Dixon et al.

[11] Patent Number: 4,800,461
[45] Date of Patent: Jan. 24, 1989

[54] MULTILAYER COMBINED RIGID AND FLEX PRINTED CIRCUITS

[75] Inventors: Herbert S. Dixon, Derry; Jonathan W. Weller, Amherst; Ivon Boyer, Merrimack; Darryl J. McKenney, Milford, all of N.H.

[73] Assignee: Teledyne Industries, Inc., Los Angeles, Calif.

[21] Appl. No.: 115,751

[22] Filed: Nov. 2, 1987

[51] Int. Cl.$^4$ .................. H05K 1/00; B44C 1/22; C23F 1/02; B05D 5/12
[52] U.S. Cl. .................. 361/398; 29/846; 29/852; 156/629; 156/630; 156/634; 156/645; 156/656; 156/253; 156/264; 156/902; 174/68.5; 361/412; 427/97; 428/192; 428/901
[58] Field of Search .......... 361/398, 408, 412, 414; 174/68.5; 29/828, 835, 837, 841, 846, 848, 852; 156/251, 253, 261, 263, 264, 629, 630, 633, 634, 645, 656, 659.1, 666, 901, 902; 427/96, 97; 428/137-140, 192, 901

[56] References Cited

U.S. PATENT DOCUMENTS

| | | | |
|---|---|---|---|
| 3,409,732 | 11/1968 | Dahlgren et al. | 174/68.5 |
| 4,037,047 | 7/1977 | Taylor | 156/629 X |
| 4,338,149 | 7/1982 | Quaschner | 156/248 |
| 4,533,787 | 8/1985 | Anderegg et al. | 174/68.5 |
| 4,626,462 | 12/1986 | Kober | 156/644 X |
| 4,687,695 | 8/1987 | Hamby | 428/192 |
| 4,715,928 | 12/1987 | Hamby | 156/630 |

*Primary Examiner*—William A. Powell
*Attorney, Agent, or Firm*—Brumbaugh, Graves, Donohue & Raymond

[57] ABSTRACT

Multilayer rigid flex printed circuits are fabricated by a novel process to provide structures having rigid sections incorporating insulator materials which, when subjected to elevated temperatures, do not expand sufficiently in the Z direction to cause difficulties, including delamination and cracking of plated through barrels. The flex section includes flexible insulator materials which extend to but not a substantial distance into the rigid section.

13 Claims, 3 Drawing Sheets

MULTILAYER COMBINED RIGID AND FLEX PRINTED CIRCUITS

BACKGROUND OF THE INVENTION

The invention relates to multilayer combined rigid and flex printed circuits having flexible printed circuits extending from the rigid board.

The techniques of making multilayer rigid flex printed circuit boards is well known in the field. One early example of the prior art is disclosed in U.S. Pat. No. 3,409,732, assigned to the assignee of the present application. Typically a rigid flex stacked printed circuit board includes flexible printed circuit cables extending from the periphery of the rigid section or sections. The rigid portions of the flex cables are typically used as sites for electronic components or mechanical hardware. It is important to note that the copper conductor in each plane or layer is fabricated from one continuous sheet of copper foil.

With improvements in electronic technology, there has been a constant need for advances in electronic packaging. This need has led to more complex multilayer rigid flex printed circuit boards with many boards now using up to twenty-five, or even more, layers of circuitry. However, severe problems developed when the rigid circuit portions included many layers of conductors and holes plated through with copper to provide conductor barrels connecting the conductor layers.

Certain problems encountered are created by the thermal expansion of typically used insulator materials, such as acrylic adhesives and Kapton ("Kapton" is a trademark of E. I. du Pont de Nemours and Company Inc. for polyimide film) utilized in the construction of rigid flex boards. Thus failures occur when the board is subjected to elevated temperatures in thermal stress testing, hot oil solder reflow, and the like. The rate of thermal expansion (a fundamental material property) of the acrylic adhesive is about 30 percent, of Kapton about 10 percent, and of copper about 4 percent. When hot oil is used to reflow solder plated on the rigid printed circuit board, temperatures on the order of 450–500 degrees F. cause expansion, for example, of the acrylic adhesive used to bond Kapton layers to copper layers in the multilayer rigid sections. As temperatures increase, the board, which is unrestrained, grows much faster in the thickness, or Z direction, than "copper barrels" formed in the plated through holes in the multilayer rigid board section. The copper barrels stretch as the acrylic adhesive and Kapton expand, sometimes fracturing the copper. Repeated cycles tend to break many of the plated copper barrels found in the holes in the rigid board sections.

If less acrylic adhesive is used to limit expansion, the internal stresses developed during lamination procedures cause unacceptable voids or delaminations in the final board. Since these deficiencies are not apparent until the final stages of construction, costly scrapping of nearly completed boards is required.

It is now apparent that multilayer rigid flex boards including insulator materials such as acrylic adhesive and Kapton will always place Z-axis stress on plated through holes. The coefficient of thermal expansion of the acrylic adhesive (Z-axis expansion) is the dominant influence. Because of the amount of acrylic required in many multilayer rigid flex applications, all plated through holes will be stressed, with many of these cracking, making these boards unusable.

To overcome the foregoing problems, several fixes have been tried. These fixes include heavier copper plating in the holes, additional layers of material in the rigid flex board, and design variations such as pads versus no pads, in non-functional layers of the plated through holes. The problems, however, have not been overcome.

Another difficulty with the use of dielectric films such as Kapton in the rigid board area is their absorption of excessive moisture, on the order of up to 3 percent by weight of water. Absorbed moisture in the circuitry, which does not escape, may volatilize during high temperature operations and cause unacceptable delamination in the rigid board area. To remove the moisture from the Kapton and acrylic layers, the board must be baked at temperatures on the order of 250 degrees F. for many hours, for example 12, 24 or even 48 hours, an expensive process.

Yet another difficulty with insulator materials such as Kapton and acrylic adhesives involves the cleaning of holes, which have been drilled through the laminated rigid board, prior to plating through such holes. The excellent chemical resistance of the acrylic adhesive to typical cleaning solutions, precludes the use of cleaning solutions for removal of smears resulting from hole drilling. Also, acrylics are prone to swelling due either to exposure to cleaning fluids during smear removal or to improper smear removal processing. To avoid these problems, plasma etching is required to clean the holes, an expensive process.

Another, although lesser consideration, is the use of insulating layers such as glass layers in the flex cables. While considerable bending is possible with a glass layer in the laminated flexible areas, some applications require the cables to be flexed repeatedly through large angles resulting in fractures and other problems; thus, elimination of a glass layer from the flex cable is, in certain circumstances, desirable.

SUMMARY OF THE INVENTION

The present invention provides a multilayer rigid flex printed circuit board that overcomes the problems discussed above associated with such boards used in the prior art.

More particularly, the inventive rigid flex board is fabricated with a novel process to provide a rigid section incorporating insulator materials which, when subjected to elevated temperatures, do not expand sufficiently in the Z direction to cause difficulties, including delamination and cracking of plated through copper barrels. Stated another way, materials causing undesirable expansion in the Z direction in the multilayer rigid section of the board, and materials absorbing excessive amounts of moisture, such as acrylic adhesives and Kapton, normally used in rigid flex boards, have been eliminated from the board's rigid section.

Moreover, it has been found that in the flex section, for example, a prepreg glass layer, when laminated with Kapton layers carrying acrylic adhesive, is sufficiently flexible to provide satisfactory results and is more tear resistant. The Kapton layers of the flex section extend to but not substantially into, the rigid section of the board.

In another embodiment of the invention, the flex section of the rigid flex circuits is fabricated by a novel process without a prepreg glass layer to afford even greater flexibility to the flex section.

BRIEF DESCRIPTION OF THE DRAWINGS

The foregoing and other features of the present invention will be more readily understood from the following detailed description and drawings, in which.

DESCRIPTION OF THE PREFERRED EMBODIMENTS

Figure 1:
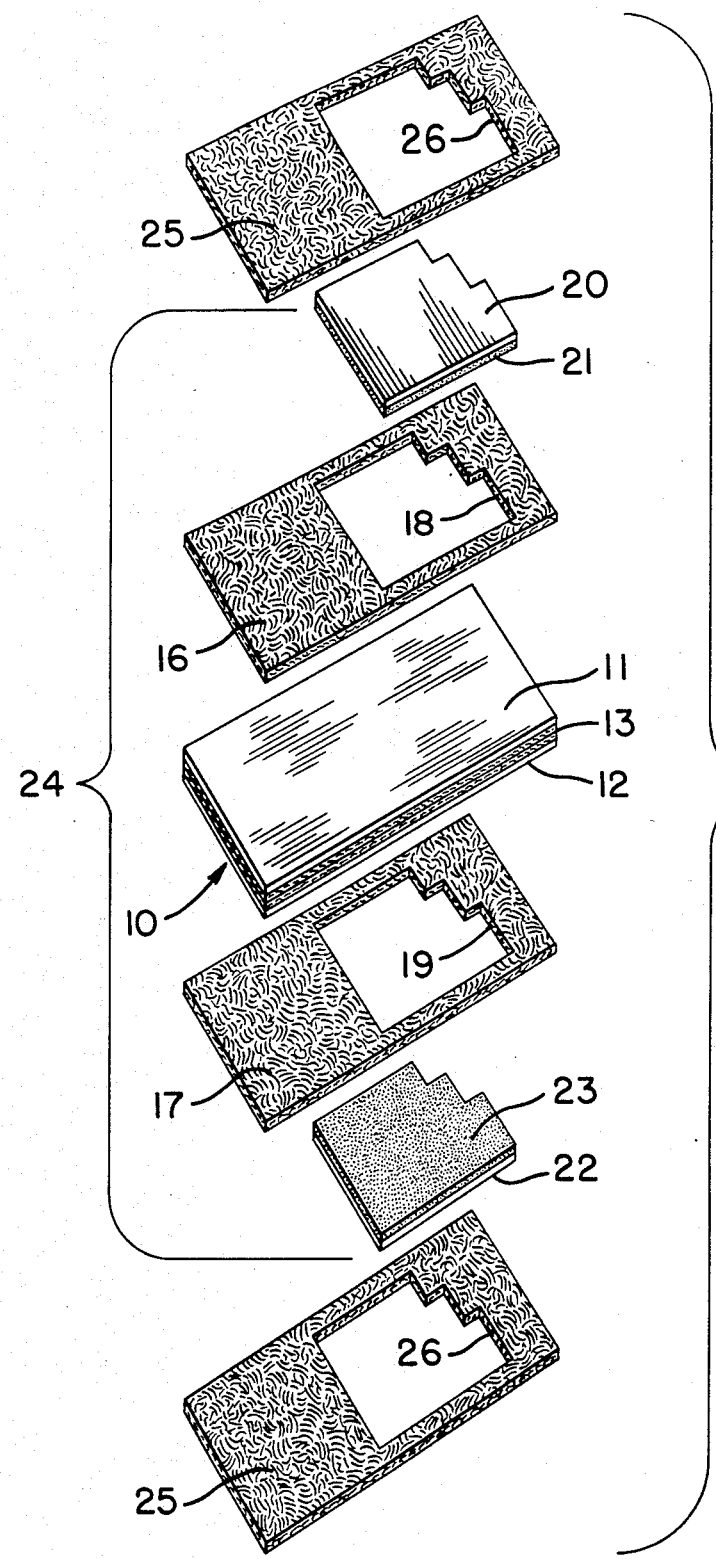
FIG. 1 is an exploded view of the sheet materials used to form the layers of structures forming the inventive rigid flex circuits.

In an exemplary embodiment of the invention shown in FIGS. 1–4, the initial processing step includes forming base stock 10 by laminating two copper sheets 11 and 12, for example one or two ounce copper, to an insulator layer 13 comprised of one or two fiberglass sheets impregnated with an adhesive such as epoxy, commonly referred to as prepreg. While two layers of glass have been shown, in order to provide at least 3.5 mils between the copper planes after lamination, for meeting military specifications, a single sheet of prepreg may be used in appropriate circumstances.

Following lamination of the base stock 10, the copper layers are imaged and etched to provide copper pads 14 and conductors 15 (shown diagrammatically in FIG. 2) on the glass layer 13. Exposed copper conductor patterns are then treated to enhance bondibility of the epoxy prepeg to the copper, for example, by the black oxide process typically used in the rigid board field.

Two additional insulator prepreg sheets 16 and 17, having cutouts 18 and 19, are positioned on both sides of the base stock 10. A flexible insulator of Kapton 20, covered with a layer of a suitable adhesive 21, for example an acrylic adhesive which provides excellent bonding of Kapton to copper, is positioned on one side of the glass sheet 16. A similar sheet of Kapton 22 covered with a layer of adhesive 23 is located on the other side of the glass sheet 17. Insulator layers such as Kapton and acrylic adhesives afford excellent flexibility and tear resistance characteristics to the flex sections, as discussed in connection with FIGS. 3 and 4.

Figure 2:
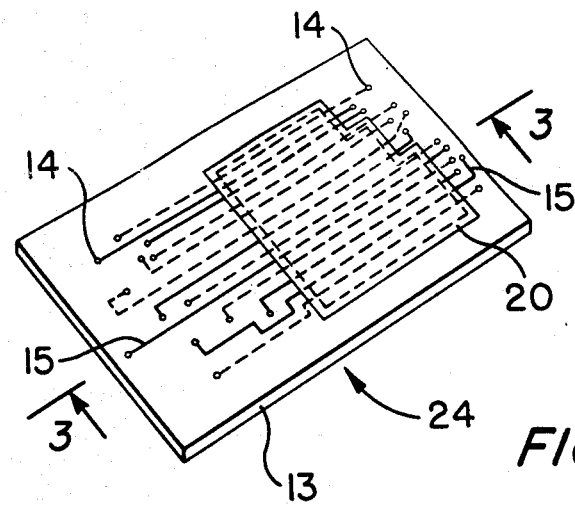
FIG. 2 is a view in perspective of the layers of FIG. 1 following lamination and certain processing steps.
Figure 3:
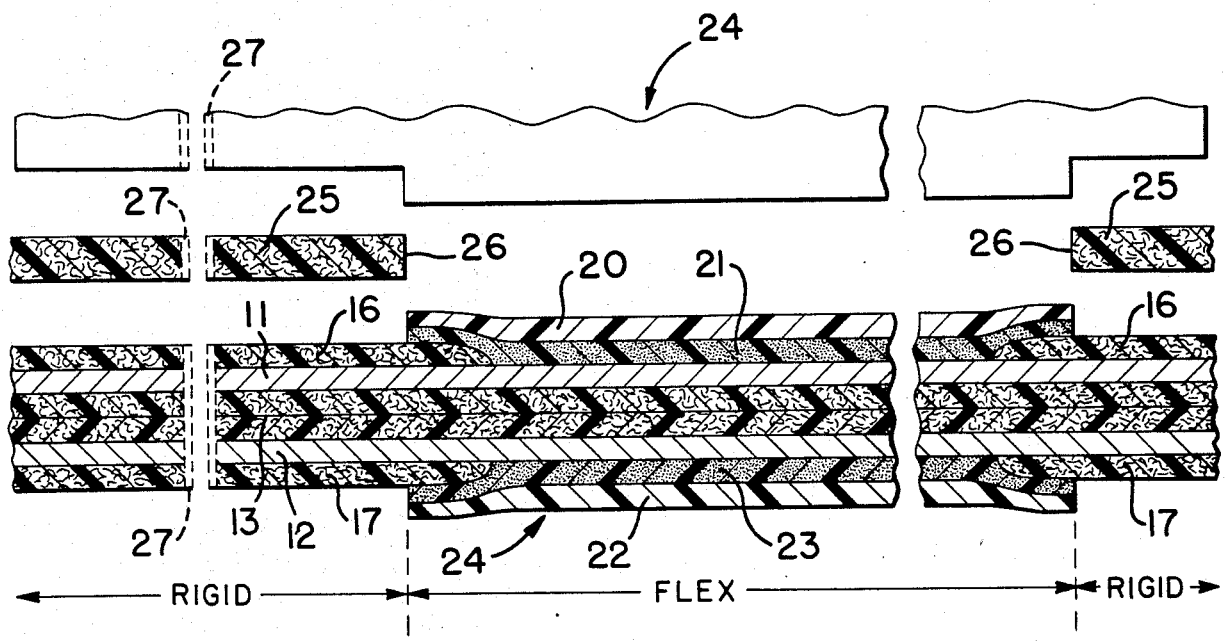
FIG. 3 is a cross section taken along view line 3—3 in FIG. 2 and enlarged in the interests of clarity.

As shown in FIG. 3, the Kapton sheets 20 and 22 and their associated adhesive layers 21 and 23 are slightly longer than the length of the cutouts 18 and 19 in the glass layers to overlap slightly the sheets 16 and 17 by, for example, 0.050 inch. The sandwich formed by the foregoing sheets is then laminated together to provide the printed circuit structure 24 shown in FIGS. 2 and 3. Note that in the interests of clarity, the sides of the cutouts 18 and 19 are not shown in FIG. 3.

After lamination processing, a number of the printed circuits 24 are stacked in proper registration with epoxy impregnated fiberglass layers 25 (FIG. 3) positioned between, for example, seven of the circuits 24. For clarity, only two of the printed circuit structures 24 are shown with the upper circuit 24 illustrated diagramatically and broken away.

Note that cutouts 26 in the prepreg sheets 25 are slightly longer than the cutouts 18 and 19 (FIG. 1) and coextensive with the Kapton layers 20 and 22 so that the Kayton layers 20 and 22 abut the edges of the sheets 25, as shown in FIG. 3.

Figure 4:
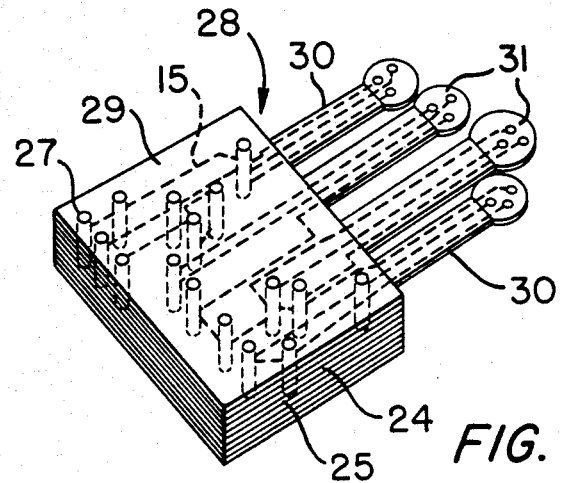
FIG. 4 is a perspective view diagrammatically showing the inventive rigid flex circuits following lamination and other processing steps of the structures shown in FIGS. 2 and 3.

Prior to stacking the circuits 24, it is desirable to cut the flex cables, shown in FIG. 4, that extend through the cutout areas, to simplify the final construction of the rigid flex printed circuit structure.

After stacking seven of the circuits 24 with appropriate outer caps, the layers are laminated to provide, in this example, a sixteen layer rigid flex circuit (the outer caps add in this example one layer per cap), and holes are then drilled at appropriate pads 14 to interconnect desired conductors 15. The holes are then desmeared by a suitable process, for example, exposing them to appropriate cleaning chemicals to expose fully the copper conductors, a rapid process due to the absence of any adhesives or insulating material resistant to such chemicals, such as acrylics and Kapton, in the rigid circuit portion. If desired, plasma desmearing techniques can be used instead of chemical cleaning.

The holes are then plated through to interconnect desired conductors 15, a portion of a plated-through barrel 27 being shown in broken lines in FIG. 3, because it will not be formed until after lamination of the circuits 24 with the prepreg layers 25.

As discussed above, problems of thermal expansion and moisture retention in the rigid section, which have been encountered in the past with materials such as Kapton and acrylic adhesives, are avoided by the absence of such materials.

Referring next to FIG. 4, which shows somewhat diagrammatically a rigid flex circuit 28 with the plated through holes 27 enlarged, in the interests of clarity, flex cables 30 coextensive with the rigid and flex sections, and extending between the rigid sections 29 and 31 for suitable connecting the printed circuits. If desired, upper and lower caps are laminated to the circuits 24 in the rigid board area 29 only. Such caps typically are fabricated using polyimide glass or epoxy glass copper-clad laminates. Copper conductor circuits can be formed on one or both sides of the caps, as desired.

With the rigid section 29, and the portions of the flex cables coextensive with the rigid section, formed by an insulator material, i.e., layers of fiberglass, and an adhesive, such as epoxy, which have characteristics or properties which allow the rigid board portion to relieve stresses, caused by heating, in the X and Y plane of the board, delamination of the circuits and cracking of the plated through barrels is prevented when the board is subjected to elevated temperatures.

In other words, the rigid board 29 does not contain troublesome materials, such as acrylic adhesive and Kapton, having high expansion rates and moisture absorption properties, because the flex cable sections including Kapton and acrylic adhesive only extend to but not substantially into the rigid section. Of course the Kapton and acrylic layers could extend an insubstantial distance into the rigid section without causing undue problems. Subjecting the inventive circuits to hot solder reflow and elevated temperatures will not cause differential expansion and contraction leading to cracking of the copper plated through barrels 27 or delamination of the layers. Moreover, extended baking times at temperatures on the order of 250° F., often as long as 48 hours, to remove moisture, are avoided.

While the invention enables the successful fabrication of multilayer rigid flex boards having a great number of conductor layers, the invention also provides excellent multilayer rigid flex boards having fewer layers, for example on the order of as few as four conductor layers.

Figure 5:
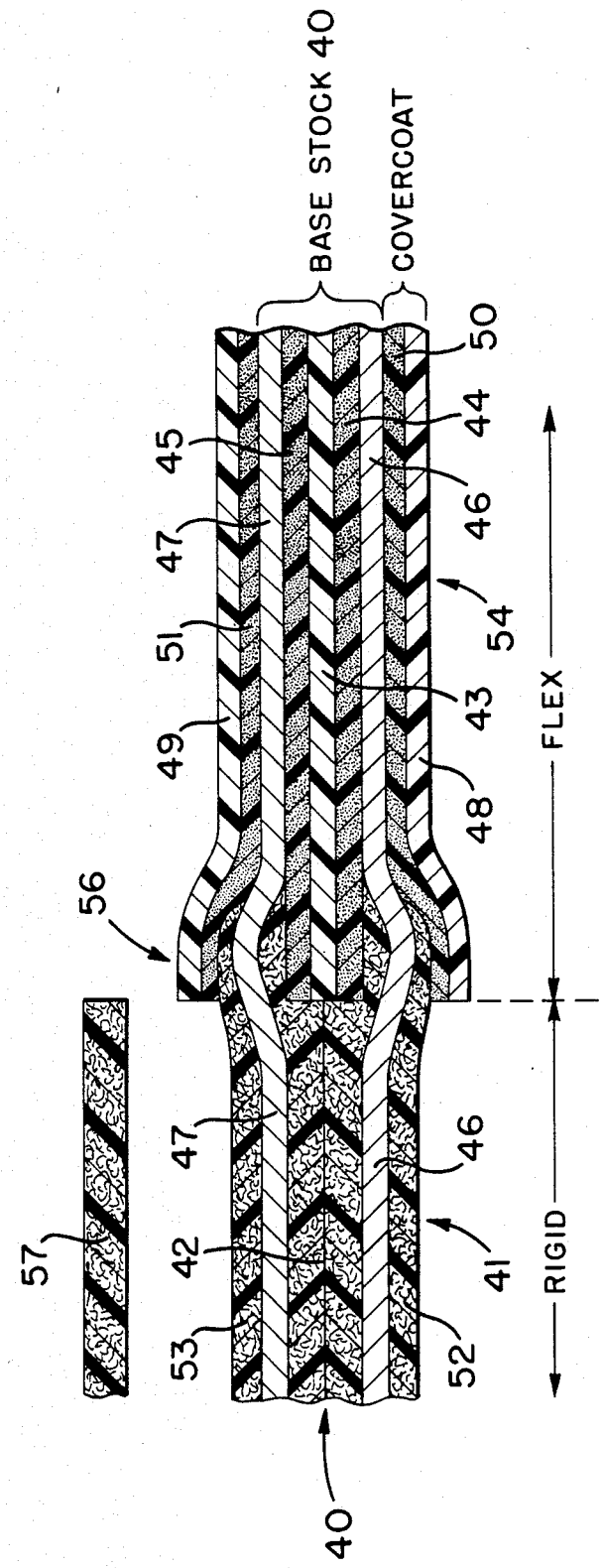
FIG. 5 is a cross section of another embodiment of the inventive rigid flex circuits.

In some instances, it is also desirable to eliminate the less flexible prepreg glass material from the flex circuit sections to afford maximum cable flexibility. Referring to FIG. 5, showing a cross-section of a circuit structure somewhat similar to that shown in FIG. 2, base stock 40 in a rigid circuit section 41 is formed of a fiberglass layer 42 impregnated with epoxy, shown here as two sheets for the reasons discussed in connection with the embodiment of FIGS. 1-4, sandwiched between copper layers 46 and 47. Inserted between the two sheets of the fiberglass layer 42 (or between the prepreg and one copper layer if a single prepreg sheet is used) is a Kapton sheet 43 coated on both sides with layers of acrylic adhesive 44 and 45. The copper sheets 46 and 47 are positioned above and below the glass layer 42 and the acrylic coated Kapton 43 and the foregoing layers are laminated together to form a base stock sandwich 40, shown in FIG. 5.

The copper layers 46 and 47 are next imaged and etched to provide copper pads and conductors as discussed in connection with FIG. 2.

Covercoats of Kapton layers 48 and 49 carrying acrylic adhesive layers 50 and 51 and shaped to be coextensive with a cutout section and slightly overlapping at least one edge, as discussed in connection with FIG. 1, and prepreg sheets 52 and 53 having suitable cutouts, are then bonded to flex section 54 and rigid section 41, respectively, by a suitable laminating process. This forms a printed circuit unit 56, similar to the circuit structure 24 shown in FIG. 2.

A desired number of individual circuit structures 56 are then stacked with epoxy glass sheets 57 between them in the rigid section, as discussed in connection with FIGS. 1-4, and the layers laminated with suitable cap layers to form the rigid flex circuit. Suitable holes are drilled and plated through to form barrels interconnecting appropriate conductors in the conductor layers to provide a rigid circuit with cables extending therefrom, as shown in FIG. 4.

The rigid flex circuits provided through stacking and laminating of the circuits 56 shown in FIG. 5 provide the advantages of the circuit of FIG. 4, due to the absence of troublesome insulator materials such as Kapton and acrylic adhesives in the rigid section of the rigid flex circuits. Moreover, cables cut in the flex section 54 have greater flexibility than the flex cables 30 of FIG. 4 due to the absence of a prepreg glass layer. However, the tear strength of the flex cables is reduced by the absence of the fiberglass layer. Of course, the novel process of fabricating the circuit of FIG. 5 is somewhat more complicated than that of FIGS. 1-4, hence is used only when maximum flexibility of the connecting flex cables is required.

While the invention has been shown and described with reference to the above described embodiments, which provide rigid flex circuits affording advantages not found in prior art printed circuits, it will be understood that various changes may be made without departing from the spirit and scope of the invention as defined in the appended claims.

We claim:

1. A process of fabricating a rigid flex printed circuit comprising the steps of laminating to an insulator layer on which has been imaged and etched conductor patterns
   (a) a pair of first insulator layers impregnated with adhesive having cutout portions and
   (b) insulator sheets covered on one side with an adhesive layer coextensive with the cutout portion and slightly overlapping at least one edge of the first insulator layers
to form a first printed circuit structure containing two conductor layers, cutting suitable flex cables in the cutout portion area, stacking a plurality of the first printed circuit structures with second insulator layers impregnated with adhesive interposed between said first circuit structures, the second insulator layers having cutout sections generally coextensive with the insulator sheets, laminating the first printed circuit structures and the second insulator layers together to form a second printed circuit structure having rigid and flexible sections, drilling holes in the rigid section of the second printed circuit structure, cleaning the holes, and plating through the holes to form conductive barrels connecting conductors in the conductor patterns of the conductor layers, whereby the second printed circuit structure is a rigid flex circuit having flexible cables cut from the areas coextensive with the cutout portions and extending from the rigid section.

2. A process as defined in claim 1, wherein the insulator layers in the rigid section are fiberglass layers impregnated with an epoxy adhesive, and the insulator sheets covered on one side with an adhesive layer are of polyimide film layers covered on one side with an acrylic adhesive.

3. A process of fabricating a rigid flex printed circuit comprising the steps of laminating two conductor layers to an insulator layer of a first composition in a rigid section and to an insulator layer of a second composition in a flexible section, imaging and etching the conductor layers to form conductor patterns, laminating to the conductor patterns
   (a) a pair of first insulator layers impregnated with adhesive having cutout portions and
   (b) insulator sheets covered on one side with an adhesive layer coextensive with the cutout portion and slightly overlapping at least one edge of the first insulator layers
to form a first printed circuit structure containing two conductor layers, cutting suitable flex cables in the cutout portion area, stacking a plurality of the first printed circuit structures with second insulator layers impregnated with adhesive interposed between said first circuit structures, the second insulator layers having cutout sections generally coextensive with the insulator sheets, laminating the first printed circuit structures and the second insulator layers together to form a second printed circuit structure having rigid and flexible sections, drilling holes in the rigid section of the second printed circuit structure, cleaning the holes, and plating through the holes to form conductive barrels connecting conductors in the conductor patterns of the conductor layers, whereby the second printed circuit structure is a rigid flex circuit having flexible cables cut from the areas coextensive with the cutout portions and extending from the rigid section.

4. A process as defined in claim 3, wherein the first composition insulator layer and the first insulator layers in the rigid section are fiberglass impregnated with an epoxy adhesive, and the second composition insulator layer and the insulator sheets covered on one side with an adhesive layer in the flexible section are of polyimide film layers carrying acrylic adhesive layers.

5. A process for the fabrication of circuit boards having rigid and flexible sections, comprising the steps of:

laminating to opposite surfaces of a first insulator layer, on which conductor patterns have been imaged and etched, (a) a first pair of layers of rigid section insulator material each having a portion removed therefrom to form a cutout which corresponds to the circuit board area to be flexible, (b) a pair of sheets of flexible section insulator material which are coextensive with the cutouts in the rigid section insulator layers and slightly overlap a respective rigid section insulator layer at an edge of the cutout therein, to form a first printed circuit structure containing two conductor layers; and cutting the sheets of flexible section material and first insulator layer to form at least one flexible cable at least partialy coextensive with the cutouts in said rigid section insulator layers.

6. A process for the fabrication of circuit boards as defined in claim 5, wherein said process includes the additional steps of:

stacking a plurality of said first printed circuit structures with interposed layers of rigid section insulator material positioned coextensive with rigid sections which are to be further laminated rigid sections;

laminating said plurality of stacked first printed circuit structures and interposed insulator layers to form a second printed circuit structure having rigid and flexible sections;

drilling holes in the rigid section of said second printed circuit structure; and plating through said holes to form conductive barrels connecting conductors in the conductor patterns.

7. A process for the fabrication of circuit boards as defined in claim 5, wherein said rigid section insulator material is fiberglass impregnated with a thermally-activatable epoxy adhesive, and said flexible section insulator material is polyimide film covered on one side with an acrylic adhesive.

8. A process for the fabrication of circuit boards as defined in claim 6, wherein said rigid section insulator material is fiberglass impregnated with a temperature-activatble epoxy adhesive, and said flexible insulator material is polyimide film covered on one side with an acrylic adhesive.

9. A process for the fabrication of circuit boards having rigid and flexible sections, comprising the steps of:

laminating a pair of conductor layers to respective opposite surfaces of a first insulator layer consisting of a rigid section having a first composition and a flexible section having a second different composition;

imaging and etching said conductor layers to form conductor patterns;

laminating to opposite surfaces of said first insulator layer (a) a pair of layers of rigid section insulator material each having a portion removed therefrom to form a cutout which corresponds to the circuit board area to be flexible, and (b) a pair of sheets of flexible section insulator material which are coextensive with said cutouts in the layers of rigid section insulator material and slightly overlap a respective rigid section insulator layer at an edge of the cutout therein, to form a first printed circuit structure containing two conductor layers; and cutting said sheets of flexible material to form at least one flexible cable at least partially coextensive with the cutouts.

10. A process for fabricating laminated circuit boards as defined in claim 9, wherein said process comprises the additional steps of:

stacking a plurality of said first printed circuit structures with interposed layers of rigid section insulator material positioned coextensive with rigid sections which are to be further laminated rigid sections;

laminating said plurality of stacked first printed circuit structures and interposed insulator layers to form a second printed circuit structure having rigid and flexible sections;

drilling holes in the rigid sections of said second printed circuit structure; and plating through said holes to form conductive barrels connecting conductors in the conductor patterns.

11. A process for the fabrication of circuit boards as defined in claim 9, wherein the composition of the rigid section of said first insulator layer and of said rigid section interposed layers is fiberglass impregnated with a temperature-activatable expoxy adhesive, and the composition of the flexible section of said first insulator layer is polyimide film covered on one side with an acrylic adhesive.

12. A process for the fabrication of circuit boards as defined in claim 10, wherein the rigid section of said first insulator layer and said interposed rigid section insulator layers are made o fiberglass impregnated with a heat-activatable epoxy adhesive, the flexible section of said first insulator layer is a sheet of polyimide film, and said flexible section insulator sheets are polyimide film covered with an acrylic adhesive on the side thereof which faces said conductor patterns.

13. A multilayer rigid flex printed circuit board fabricated by a process comprising the steps of claim 5, 6, 7, 8, 9, 10, 11 or 12.

* * * * *